United States Patent [19]

Mamodaly et al.

[11] Patent Number: 4,783,638
[45] Date of Patent: Nov. 8, 1988

[54] FREQUENCY DOUBLING OSCILLATOR WORKING AT ULTRA-HIGH FREQUENCIES

[75] Inventors: Marguise Mamodaly; Pascal Colin, both of Paris; Alain Bert, Gif Sur Yvette; Juan Obregon, Taurion, all of France

[73] Assignee: Thomson-CSF, Paris, France

[21] Appl. No.: 60,162

[22] Filed: Jun. 10, 1987

[30] Foreign Application Priority Data

Jun. 13, 1986 [FR] France .......................... 86 08584

[51] Int. Cl.[4] .................................... H03B 5/18
[52] U.S. Cl. .................. 331/99; 331/117 D; 331/117 FE
[58] Field of Search ............... 331/96, 99, 100, 117 D, 331/117 FE

[56] References Cited

PUBLICATIONS

Pavio et al., "A20-40-GHz Push-Push Dielectric Resonator Oscillator", IEEE Transactions on Microwave Theory and Techniques, vol. MTT-33, Dec. 1985, pp. 1346-1349.

Primary Examiner—Siegfried H. Grimm
Attorney, Agent, or Firm—Oblon, Fisher, Spivak, McClelland, & Maier

[57] ABSTRACT

The invention pertains to a doubling oscillator with low noise in the vicinity of the carrier frequency. The doubling oscillator of the invention is of the "push-push" type comprising two parallel-mounted transistors. The gates of these two transistors have a common oscillating circuit comprising two microstrip lines, two resistors and a common dielectric resonator positioned between the two microstrip lines. To reduce the low-frequency noise in the vicinity of the carrier near the load, the non-correlated low frequency noise sources of the transistors are either placed in series by means of a choke and two capacitances mounted at the ends of the microstrips or loaded at an infinite impedance through two capacitances mounted at the ends of the microstrips. This oscillator has applications in ultra-high frequency systems, radars and telecommunications.

6 Claims, 2 Drawing Sheets

FIG_1 PRIOR ART
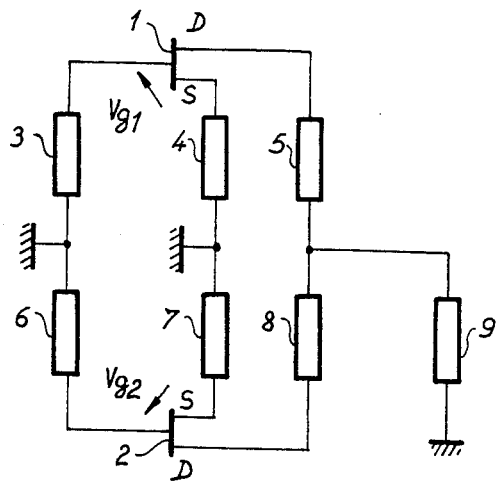
FIG_2
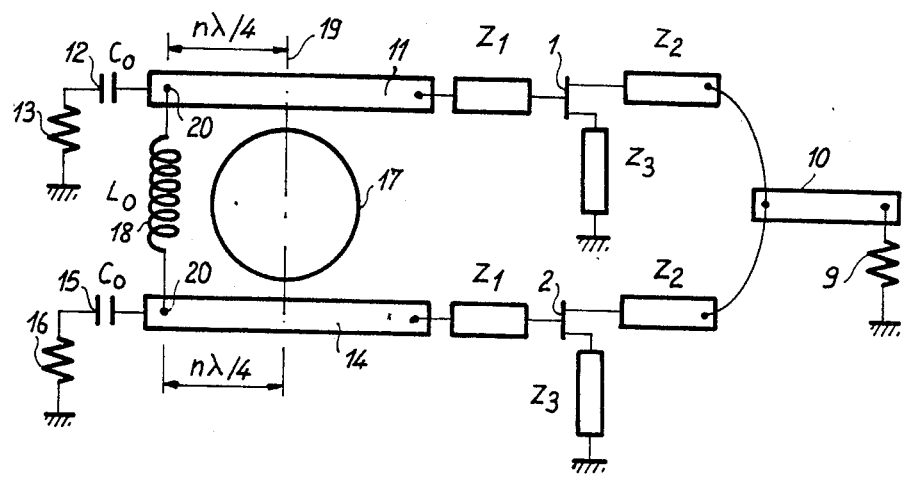

FIG_3
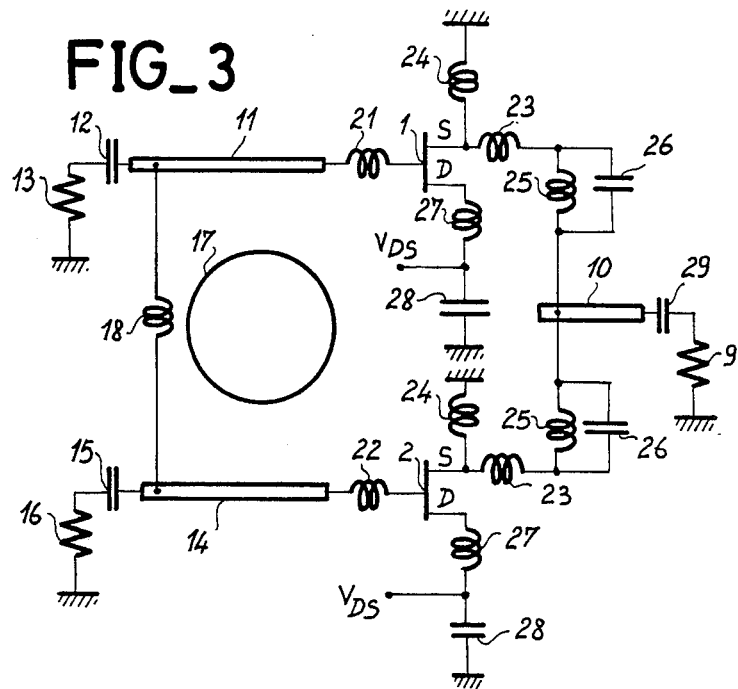
FIG_4
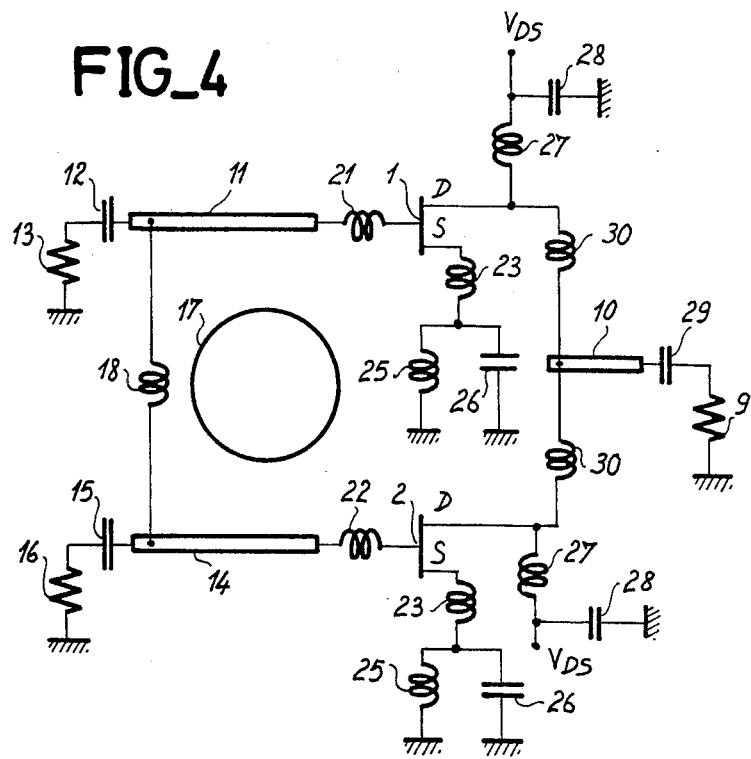

FREQUENCY DOUBLING OSCILLATOR WORKING AT ULTRA-HIGH FREQUENCIES

BACKGROUND OF THE INVENTION

1. Field of the Invention

The present invention pertains to an ultra-high frequency oscillator with low noise in the vicinity of the carrier frequency. This oscillator is of the doubling type, i.e. the frequency delivered to the load is double the oscillation frequency of the transistors in the so-called push-push mode of assembly. A decrease in the noise close to the central frequency is obtained by means of an optimum low-frequency impedance placed between the gates of the two transistors, this circuit either placing the non-correlated noise sources in series or preventing the low-frequency noise sources of the transistors from being grounded.

It is important for both present-day and future ultra-high frequency oscillators, which work at several tens of gigahertz, that the frequency which they deliver to a load is as pure as possible, i.e. that there is no spurious oscillation within a band of frequencies close to the central frequency known as the carrier: for example, in a band of ten kHz around 20 GHz.

2. Description of the Prior Art

There are various means in the prior art to obtain this result. They vary according to the pattern of the oscillator considered. For example, in a feedback oscillator, the limiting and amplifying functions can be separated, but this type of oscillator requires transistors which oscillate at 10 GHz if the carrier is at 100 GHz. Transistors of this type are very small in size and lack power.

3. Summary of the Invention

The so-called push-push assembly used in the invention has the advantage of requiring only two transistors which oscillate at 50 GHz if a 100 GHz carrier is sought. In this assembly, the two transistors are mounted in parallel and their gates are linked to two microstrips, parallel to each other, between which a ceramic dielectric resonator is positioned. The microstrips are grounded through a resistor, conventionally of 50 ohms. If each transistor is considered separately, the resonating circuit comprising the microstrip and the dielectric resonator is well known, but each of the two resonating circuits does not cancel the low-frequency noise at the transistors.

According to the invention, the sources of non-correlated low-frequency noises of field-effect transistors are:

Either loaded with an infinite impedance by means of a high-value capacitance placed between the end of the gate microstrip and the grounded resistor. This capacitance prevents the grounding of the low-frequency noise sources and hence reduces the medium-frequency noise at the second harmonic, Or placed in series by means of a choke which joins the two transistor gate microstrips to each other, this choke being soldered at points located between the dielectric resonator and the end of the microstrip joined to a resistor, such that the low-frequency noise around the second harmonic in the load is reduced and shifted to a distance away from the carrier. The sources of the low-frequency noises of the transistors can be placed in series because, for each microstrip, a capacitance is interposed between the end of the microstrip and the grounded resistor: the value of these capacitances is high enough for the capacitance to be equivalent to a short circuit at ultra-high frequencies and act as an open circuit at low frequencies, and for the preceding choke to join the two gates as regards low-frequencies.

More precisely, the invention pertains to a frequency-doubling oscillator, working at ultra-high frequencies, comprising, in a so-called push-push assembly, two field-effect transistors working in parallel, with their source and drain electrodes connected to impedances, the working load being connected to a point common to the impedances of the output electrodes of both transistors, the gates of each transistor being connected, by an impedance, to a first end of a microstrip line, the second end of which is grounded by a resistor, a dielectric resonator being placed between the two microstrip lines at a point such that oscillation is obtained. In the disclosed oscillator, in order to reduce the low-frequency noise in the load near the main frequency, known as the carrier frequency, the noise sources at the transistors are insulated from the ground at direct current and loaded with a low-frequency impedance of infinite value, consisting of two high-value capacitances, each of these two capacitances being interposed between the second end of a microstrip line and its grounding resistor.

DESCRIPTION OF THE DRAWINGS

The invention will be better understood from a more detailed description of an example of an embodiment, made with reference to the appended figures, of which:

FIG. 1 is a simplified diagram of a push-push oscillator according to the prior art, FIG. 2 is an electrical diagram of an oscillator according to the invention, FIG. 3 is an example of an embodiment of the oscillator according to the invention, the load being connected to the sources, FIG. 4 is a diagram of an embodiment of the oscillator according to the invention, the load being connected to the drains.

DESCRIPTION OF THE PREFERRED EMBODIMENT

FIG. 1 is a highly simplified diagram of a doubling oscillator in a so-called push-push mode of assembly. It comprises two field-effect transistors 1 and 2 which are mounted in parallel. The three gate, source and drain electrodes of each transistor are joined to impedance circuits: those of the first transistor to the impedance circuits 3, 4 and 5 and those of the second transistor to the impedance circuits 6, 7 and 8. The gate and source impedances can be grounded, giving the circuit its looped character. The load 9 is connected to the middle point of the output impedances 5 and 8. If the transistors 1 and 2 oscillate at 15 GHz for example, the oscillation frequency in the load is double, i.e. 30 GHz, which is the second harmonic.

The gate impedances 3 and 6 may each be formed by a microstrip and a dielectric resonator suitably positioned for the desired frequency. The dielectric resonator can also be common to both gate microstrips. But this topology converts the low-frequency noise into medium-frequency noise close to the carrier frequency because each noise generator gives converted noise.

This pattern is known in the prior art, but the invention brings modifications which improve it by removing the noise near the carrier.

For the two transistors 1, and 2, the gate ultra-high frequency voltages (which must not be confused with the bias voltages) are called $v_{g1}$ and $v_{g2}$ and the drain ultra-high frequency currents are called $i_{d1}$ and $i_{d2}$. If the currents $i_{d1}$ and $i_{d2}$ are in opposite phase at the fundamental frequency and in phase at the second harmonic, it can be shown that only the second harmonic exists in the load. For:

$$i_{d1} = av_{g1} + bv_{g1}^2 + cv_{g1}^3 + dv_{g1}^4$$

If the two transistors are identical, as is the rule, and in opposite phase in the fundamental mode, $$v_{g2} = -v_{g1}$$

Hence $$i_{d2} = -av_{g1} + bv_{g1}^2 - cv_{g1}^3 + dv_{g1}^4$$

The sum in the load is $$i_d = 2bv_{g1}^2 + 2dv_{g1}^4$$

Furthermore, $$v_{g1} v_g + v_{b1} + v_{b2}$$

Wherein:

$v_g$ is the ultra-high frequency voltage of the transistor in the fundamental mode, $v_{b1}$ is the low-frequency noise voltage due to the transistor 1, $v_{b2}$ is the low-frequency noise voltage due to the transistor 2.

When the gates of low-frequency circuits are in series, the low-frequency noise source of the transistor 2 is also in series with the low-frequency noise source of the transistor 1, but if the noise sources of the transistors are not correlated (as is the case in the invention) we get:

$$\overline{v_{b1} \cdot v_{b2}} 0$$

If the drain current $i_d$ is written in a more general form $$I_d = A v_g^2 + B v_g^4 = A v_g \sin^2 \omega t + B v_g^3 \sin^4 \omega t$$

($\omega$ being the angular frequency) it is seen that the current in the load comprises terms in:

$$2\omega_0 \text{ and } 2\omega_0 \pm 2\omega_b$$

$\omega_0$ = fundamental mode angular frequency,
$\omega_b$ = low frequency noise angular frequency.

There is noise in $2\omega_0 \pm 2\omega_b$, but it is at a further distance from the carrier frequency ($2\omega_0$) and less troublesome than the noise $2\omega_0 \pm \omega_b$ of conventional oscillators.

The non-correlated low-frequency noise sources are placed in series by means of a choke and two capacitances according to the diagram of FIG. 2 which shows an oscillator according to the invention in a general form. This low-frequency choke contributes to obtaining the condition wherein the low-frequency noise generators are in opposite phase.

In this diagram, the field-effect transistors 1 and 2 have their sources and drains connected to impedances $Z_2$ and $Z_3$, the details of which will be given later in FIGS. 3 and 4. The load 9 is joined to the common point of the output impedances $Z_2$ by means of a microstrip 10.

The gate of the first transistor 1 is joined by a metal wire (forming an impedance $Z_1$) to a first end of a microstrip 11, the second end of which is joined, through a capacitance 12 with a high value $C_0$, to a grounded resistor 13. In the same way, the gate of the second transistor 2 is joined by a metal wire to a microstrip 14, a capacitance 15 and a resistor 16. The two microstrips 11 and 14 are parallel to one another and a dielectric resonator 17 is positioned between the microstrips 11 and 14 so that the circuit oscillates at the desired frequency and so as to meet the condition wherein the currents are in opposite phase at the fundamental frequency. A choking coil with a value $L_0$, comprising a copper wire winding, is mounted as a bridge between the two microstrips 11 and 14, and soldered at points which will be specified further below.

The dielectric resonator 17, coupled to the two microstrip lines 11 and 14, gives the condition of phase opposition for $v_{g1}$ and $v_{g2}$ at the fundamental frequency. But furthermore, the dielectric resonator 17 is equivalent, in its plane of coupling (19) with the microstrips 11 and 14, to a circuit open at its resonance frequency and to a short circuit at other frequencies. It therefore has almost no influence at low frequency, and the low frequency noise sources, coupled in series by the choking coil 18, cancel each other. The choking coil 18, with a high value $L_0$, is equivalent to an impedance with an infinite value at the resonance frequency of the dielectric resonator 17, and it therefore has no effect at ultra-high frequencies.

The two capacitances 12 and 15, with a high value $C_0$ (for example 20 pF) are necessary to couple the two noise sources in series. Their effect is that the direct bias voltage of the gates is no longer given with reference to ground, but this is of no importance as the gates are self-biased. However, these two capacitances 12 and 15 make it possible to close the circuit off from the noise sources.

To regulate the oscillator according to the invention, the operation is first done without the choking coil 18. The dielectric resonator 17 is shifted along two microstrips (crosswise if necessary) until the desired frequency is obtained at the load 9. The final position determines the coupling plane 19.

The point 20 at which the choke 18 should be soldered to the microstrip 11, or 14, must be at a distance from the coupling plane 19, the length of this distance being equal to $\lambda/4$, ($\lambda$ being the guided wavelength at the working frequency of the transistors) or to a multiple of $\lambda/4$ if the frequency is too high for it to be possible to solder a wire at 20, given the space factor of the resonator 17.

For example, if the frequency in the load is 20 GHz, the transistors work at 10 GHz, $\lambda/4 = 2.9$ mm and the resonator 17 has a diameter of 4 mm, then it is possible to make a soldering connection at 20 at a distance of $\lambda/4$. If the frequency in the load is 30 GHz, $\lambda/4 = 1.9$ mm. at 15 GHz and the resonator has a diameter of 3.4 mm, then it is preferable to do the soldering at 20 at $3\lambda/4$.

Another way to reduce the medium-frequency noise of an oscillator is to have the low-frequency noise generators loaded with an infinite impedance. This is a worthwhile solution when it is sought to make oscillators of higher frequencies. In this case, the choke $L_0$ 18, which places the two noise sources in series, is not used.

The capacitances 12 and 15, interposed between the ends of the gate microstrips 11 and 14 and the grounding resistors 13 and 16, are equivalent to a circuit which is open at low frequencies. Consequently, the noise sources are loaded with an infinite impedance, and this results in a noise reduction.

The diagram of the oscillator in this alternative embodiment of the invention is the same as the one shown in FIG. 2, or in FIGS. 3 and 4, but without the choke $L_0$ 18 which places the noise sources in series.

At 30 GHz, an oscillator according to the invention, fitted with two capacitances 12 and 15, shows an improvement of 5 dB as compared with an oscillator of the prior art in push-push assembly, without these capacitances.

FIG. 2 shows the general example of a doubling oscillator according to the invention. The source and drain electrodes of the transistors 1 and 2 are coupled to impedances $Z_2$ or $Z_3$ depending on whether the load 9 is connected to the sources of the transistors (FIG. 3) or to their drains (FIG. 4).

In both cases, the impedances $Z_1$ of the transistor gates 1 and 2 are formed by the wire or metal band connecting them to the microstrips 11 and 14.

If the load 9 is coupled to the sources (FIG. 3), the source impedance $Z_2$ comprises, for each transistor, a chocke 24 which is grounded, and a choke 23 in series with a parallel LC circuit comprising a choke 25 and a capacitance 26, this circuit being connected to the microstrip 10 providing connection with the load 9.

Similarly, the drain impedance $Z_3$ comprises, for each transistor, a choke 27 in series with a grounded capacitance 28. The bias voltage $V_{DS}$ is applied to the transistors at the common point of the choke 27 and the capacitance 28.

A high-value capacitance 29, interposed between the microstrip 10 and the load 9, uncouples the load from the direct bias voltage.

If the load 9 is coupled to the drains (FIG. 4), the diagram is very similar to the previous one.

The source impedances $Z_2$ comprise the same chokes 23 and 25 and capacitance 26, but without the choke 24. The LC circuit 25+26 is grounded.

The drain impedances $Z_3$ comprise the same choke 27 and capacitance 28, with bias by a voltage $V_{DS}$ applied to the common point of the choke 27 and the capacitance 28. But, a choke 30 is connected between the drain and the microstrip 10.

Of course, a high-value (20 pF) capacitance 29 uncouples the load 9 from the direct voltage.

With the doubling oscillator according to the invention, an improvement of 5 dB$_c$/Hz at 10 kHz of the 20 GHz carrier has been obtained with the medium-frequency noise, owing to the presence of the choke 18. While the noise measured at 10 kHz of the carrier was equal to $-83$ dB$_c$/Hz without the choke 18 (namely in an assembly of the prior art), it is equal to $-88$ dB$_c$/Hz in an oscillator according to the invention, with the choke 18 placed in series between the microstrips 11 and 14 of the gates. The best results in terms of reducing medium-frequency noise are obtained if the imaginary part of the resonator has a steep slope and if the oscillation frequency is equal to the frequency of the fundamental mode of the resonator.

The doubling oscillator of the invention is used in ultra-high frequency systems for telecommunications, radars and electronics for professional data processing.

What is claimed is:

1. A Frequency-doubling oscillator, working at ultra-high frequencies, comprising:
    two field-effect transistors in a push-push assembly, working in parallel, with their source and drain electrodes connected to impedances, the working load being connected to a point common to the impedances of the output electrodes of both transistors, the gate of each transistor being connected, by an impedance, to a first end of a microstrip line, the second end of which is grounded by a resistor, a dielectric resonator being placed between the two microstrip lines at a point such that oscillation is obtained; wherein, in order to reduce the low-frequency noise in the load near the main frequency, known as the carrier frequency, the noise sources attributable to the transistors are isulated from the ground for direct current and loaded with a low-frequency impedance of infinite value by two high-value capacitances, each of these two capacitances being interposed between the second end of a microstrip line and its grounding resistor.

2. The oscillator according to the claim 1 wherein, in order to place non-correlated noise sources in series, the low-frequency impedance further comprises a choke connected between the second ends of the microstrip lines.

3. The oscillator according to the claim 1 wherein, the gate currents of the transistors are in opposite phase for the fundamental frequency and in phase for the second harmonic, the low-frequency noise in the load is at a distance from the carrier frequency and at a frequency defined by $2\omega_0 \pm 2\omega_b$, $\omega_0$ being the fundamental angular frequency and $\omega_b$ being the angular frequency of the low-frequency noise.

4. The oscillator according to the claim 2 wherein, the dielectric resonator defines a coupling plane with the two microstrip lines, and the ends of the choke are soldered to the second ends of the microstrip lines at a point which is at a distance from the coupling plane by a length which is a multiple of $\lambda/4$, $\lambda$ being the guided wavelength of the fundamental frequency.

5. The oscillator according to any of the claims 1 to 4, wherein the load is connected to the transistor source circuits.

6. The oscillator according to any of the claims 1 to 4, wherein the load is connected to the transistor drain circuits.

* * * * *